United States Patent [19]

Ueno et al.

[11] Patent Number: 4,629,520
[45] Date of Patent: Dec. 16, 1986

[54] METHOD OF FORMING SHALLOW N-TYPE REGION WITH ARSENIC OR ANTIMONY AND PHOSPHORUS

[75] Inventors: Katsunobu Ueno; Osamu Hataishi, both of Yokohama, Japan

[73] Assignee: Fujitsu Limited, Kawasaki, Japan

[21] Appl. No.: 640,577

[22] Filed: Aug. 14, 1984

[30] Foreign Application Priority Data

Aug. 30, 1983 [JP] Japan ................................ 58-159949

[51] Int. Cl.⁴ .................. H01L 21/385; H01L 21/425
[52] U.S. Cl. .................................... 148/188; 148/190; 29/571; 29/576 B
[58] Field of Search .................. 148/188, 190; 29/571, 29/576 B

[56] References Cited

U.S. PATENT DOCUMENTS

| | | | |
|---|---|---|---|
| 4,364,166 | 12/1982 | Crowder et al. | 148/188 X |
| 4,403,392 | 9/1983 | Oshima | 148/188 X |
| 4,404,048 | 9/1983 | Vogelzang | 148/190 X |
| 4,419,810 | 12/1983 | Riseman | 148/188 X |
| 4,495,010 | 1/1985 | Kranzer | 148/188 X |
| 4,512,074 | 4/1985 | Sasaki | 148/188 X |
| 4,542,580 | 9/1985 | Delivorias | 148/188 |

*Primary Examiner*—George T. Ozaki
*Attorney, Agent, or Firm*—Staas & Halsey

[57] ABSTRACT

A method of forming a shallow n-type region of a semiconductor device, such as a bipolar transistor or a MOS FET, includes the following steps. Forming a first film containing arsenic or antimony on a silicon substrate; forming a second film containing phosphorus on the first film; and diffusing the arsenic or antimony and the phosphorus into the semiconductor substrate out of the first and second films by heat-treatment. The diffused impurities of the arsenic or antimony and the phosphorus form the n-type region and the arsenic or antimony defines the depth of the n-type region.

8 Claims, 9 Drawing Figures

METHOD OF FORMING SHALLOW N-TYPE REGION WITH ARSENIC OR ANTIMONY AND PHOSPHORUS

BACKGROUND OF THE INVENTION (1) Field of the Invention

The present invention relates to a method of producing a semiconductor device, more particularly to a method of forming a shallow n-type region in a semiconductor device, such as a bipolar transistor, a metaloxide semiconductor field-effect transistor (MOS FET), or a diode. The present invention can be suitably applied to form a shallow emitter region of an npn-type bipolar transistor.

(2) Description of the Prior Art

Integrated circuits (IC's) comprising bipolar transistors or MOS FET's have recently been made denser by miniaturization of individual elements of the IC's. The final aim of all this, of course, is to further increase the speed of operation and improve the frequency characteristics of the IC and the individual transistors.

In the case of a bipolar transistor, narrowing of the width of the base region between an emitter region and a collector region is most effective for improving the speed of operation and frequency characteristics. Therefore, it is important to form a shallow junction. Various methods for forming a shallow junction have been proposed. One effective method of formation which has recently been used frequently includes: forming a polycrystalline silicon film on an exposed p-type base region of a silicon substrate and on a silicon oxide film selectively formed on the base region. Then, arsenic ions and phosphorus ions are doped into the polycrystalline silicon film by an ion-implantation method. Finally the arsenic ions and phsophorus ions are thermally diffused into the base region out of the polycrystalline silicon film by heat-treatment to form a shallow n-type emitter region.

In this case, the formation of the polycrystalline silicon film prevents the silicon substrate from being damaged by the ion-implantation. The use of both arsenic and phosphorus as the n-type impurity results in less crystal lattice strain since the larger atomic radius of arsenic compared with that of silicon is compensated by the smaller atomic radius of phosphorus compared with that of silicon. More specifically, when impurities are diffused into a single crystalline substrate, the diffused impurities cause crystal lattice strain. Diffusion of either arsenic or phosphorus alone increases the crystal lattice strain and, under certain circumstances, generates abnormal diffusion resulting in an emitter-collector short-circuit.

The diffusion depth of the n-type impurities determines the dimensions of the n-type emitter region and, in turn, the width of the base region. Since the diffusion coefficient of phosphorus is larger than that of arsenic, it is the diffusion depth of phosphorus that essentially determines the emitter region. However, it is more difficult to control the diffusion depth of phosphorus than arsenic or, in the case of the p-type impurity for the base region, boron. Therefore, this method of formation is difficult in that it is necessary to exactly adjust the emitter depth. It is possible to try doping phosphorus ions shallowly into the polycrystalline silicon film by decreasing the implantation energy of the phosphorus ions, but such shallow implantation is difficult because of the implantation apparatus.

SUMMARY OF THE INVENTION

An object of the present invention is to form a shallow n-type region with a depth defined by the diffusion depth of arsenic and with low crystal lattice strain.

Another object of the present invention is to form a shallow n-type emitter region with a depth controlled by the diffusion of arsenic to attain a suitable width for a base region.

These and other objects of the present invention are attained by a method of forming a shallow n-type region of a semiconductor device including the steps of: forming a first film containing arsenic or antimony on a silicon substrate; forming a second film containing phosphorus on the first film; and thermally diffusing the arsenic or antimony and the phosphorus into the semiconductor substrate out of the first and second films by heat-treatment.

Since the first film containing arsenic lies between the substrate and the second film containing phosphorus, arsenic diffuses directly into the substrate and phosphorus diffuses into the substrate through the first film. The diffusion depth of phosphorus in the substrate corresponds to the entire diffusion length of phosphorus minus the thickness of the first film. Therefore, it is possible to prevent the diffusion depth of phosphorus from exceeding that of arsenic. As a result, the n-type region can be defined by the depth of the arsenic, which can be controlled more accurately than that of phosphorus.

BRIEF DESCRIPTION OF THE DRAWINGS

The present invention will be clearer from the description of the preferred embodiments set forth below with reference to the accompanying drawings, in which.

DESCRIPTION OF THE PREFERRED EMBODIMENTS

Before describing the preferred embodiments of the present invention, a prior art technique for the formation of a shallow n-type region of a bipolar transistor is discussed.

Figure 1:
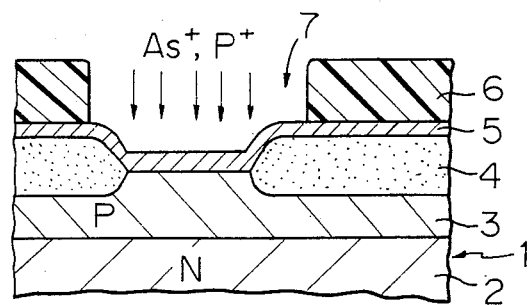
FIGS. 1 and 2 are sectional views of a bipolar transistor in various stages of production in accordance with a prior art technique.

As illustrated in FIG. 1, a silicon substrate 1 comprises a p-type silicon single-crystalline substrate (i.e., wafer, not shown) and a silicon epitaxial layer formed thereon, the epitaxial layer comprising an n-type collector region 2 and a p-type base region 3. An oxide film 4 made of, e.g., silicon dioxide and having a window is formed on the epitaxial layer (in this case, on the base region 3) by a conventional method. The window exposes a portion of the base region 3. A polycrystalline silicon film 5 having a thickness of, e.g., from 0.2 to 0.3 μm is formed on the oxide film 4 and the exposed portion of the base region 3 by a conventional method, e.g., a chemical vapor deposition (CVD) method. A resist film 6 having an opening 7 is formed on the polycrystalline silicon film 5. The arsenic and phosphorus ions are doped into the polycrystalline silicon film 5 through the opening 7 by an ion-implantation method. The resist film 6 serves as a mask for stopping the implantation of ions.

Figure 2:
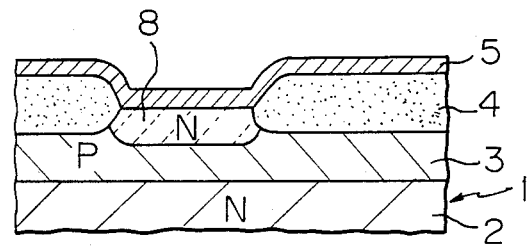

The resist film 6 is removed, then the obtained silicon substrate 1 is heated at an elevated temperature of approximately 1000° C. to diffuse the arsenic and phosphorus into the p-type base region 3 out of the polycrystalline silicon film 5. Thus, the diffused arsenic and phosphorus form a shallow n-type emitter region 8 within the base region 3 of the substrate 1, as illustrated in FIG. 2.

Figure 3:
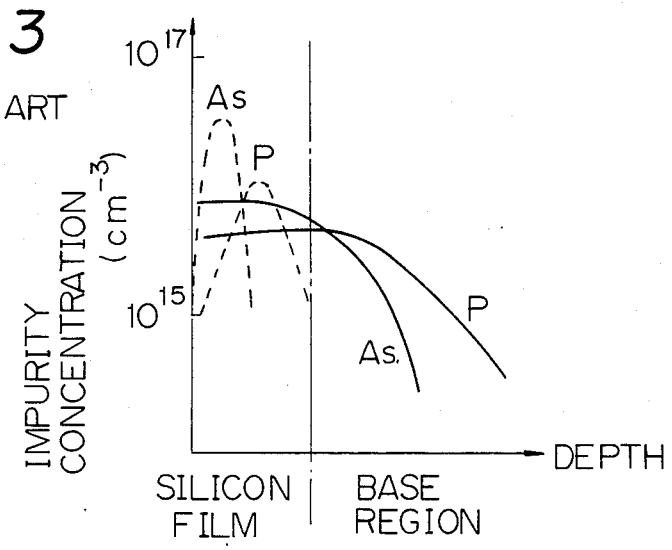
FIG. 3 is a graph showing the doping profile and diffusion profile of phosphorus and arsenic in the case of the prior art.

FIG. 3 illustrates the distribution of impurity concentration, i.e., the doping profiles and diffusion profiles of the arsenic and phosphorus wherein the ordinate represents the impurity concentration and the abscissa represents the depth from the polycrystalline silicon film surface to the base region. The dotted lines indicate the distribution of impurity concentration (i.e., the doping profiles) of arsenic and phosphorus in the polycrystalline silicon film after the ion-implantation, while the solid lines indicate the distribution of impurity concentration (i.e., the diffusion profiles) of arsenic and phosphorus after the diffusion heat-treatment. It is apparent from FIG. 3 that the diffusion depth of phosphorus is deeper than that of arsenic, so that the depth of the n-type emitter region 8 depends on the diffusion of phosphorus. However, the exact control of the emitter depth is difficult, as mentioned above. Use of arsenic alone for exact control of the emitter depth results in a large amount of crystal lattice strain.

Figure 4:
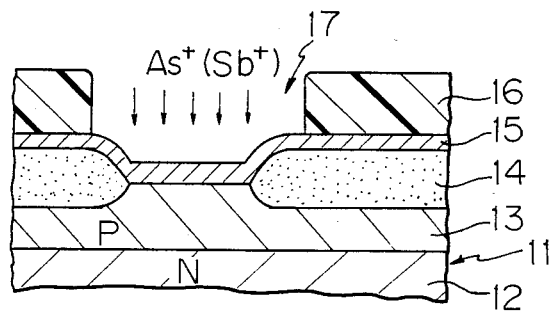
FIGS. 4 through 7 are sectional views of a bipolar transistor in various stages of production according to the method of forming an n-type region of the present invention.

An explanation will now be given, referring to FIGS. 4 through 7, of a method of forming a shallow n-type region of a semiconductor device in accordance with a preferred embodiment of the present invention. As illustrated in FIG. 4, a silicon substrate 11 comprises a p-type silicon single crystalline substrate (not shown) and a silicon epitaxial layer formed thereon, the epitaxial layer comprising an n-type collector region 12 and a p-type base region 13. The impurity of the base region 13 is, e.g., boron and the depth of the base region 13 is, e.g., 0.4 μm. An oxide film 14 of, e.g., silicon dioxide, having a thickness of, e.g., 0.5 μm and having a window, is formed on the base region 13 by a conventional method (e.g., by selectively oxidizing the silicon epitaxial layer). The window exposes a portion of the base region 13. A first polycrystalline silicon film 15 having a thickness of from 0.05 to 0.15 μm (e.g., 0.1 μm) is formed on the oxide film 14 and the exposed portion by a conventional method (e.g., a CVD method). A first resist film 16 having an opening 17 above the window is formed on the first polycrystalline silicon film 15. The arsenic ions are doped into the first polycrystalline silicon film 15 through the opening 17 by an ion-implantation method at an energy of from 40 to 100 keV (e.g., 50 keV) to a dosage of from 2 to $8 \times 10^{15}$ ions/cm$^2$ (e.g., $5 \times 10^{15}$ ions/cm$^2$). It is possible to use antimony ions instead of the arsenic ions, since antimony has a diffusion coefficient and atomic radius similar to those of arsenic as compared with the relationship between phosphorus and the silicon substrate. The first resist film 16 serves as a mask for stopping the implantation ions.

Figure 5:
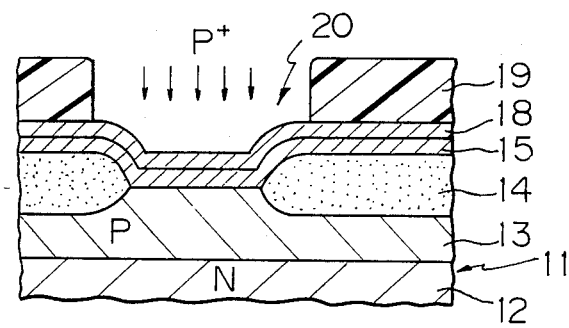

Next, after removal of the resist film 16, a second polycrystalline silicon film 18 having a thickness of from 0.1 to 0.25 μm (e.g., 0.2 μm) is formed on the first polycrystalline silicon film 15 by a CVD method, as illustrated in FIG. 5. A second resist film 19 having an opening 20 above the window is formed on the second polycrystalline silicon film 19. The phosphorus ions are doped into the second polycrystalline silicon film 19 through the opening 20 by an ion-implantation method at an energy of from 30 to 40 keV (e.g., 30 keV) to a dosage of from 1 to $4 \times 10^{15}$ ions/cm$^2$ (e.g., $2 \times 10^{15}$ ions/cm$^2$). The second resist film 19 is removed.

Figure 6:
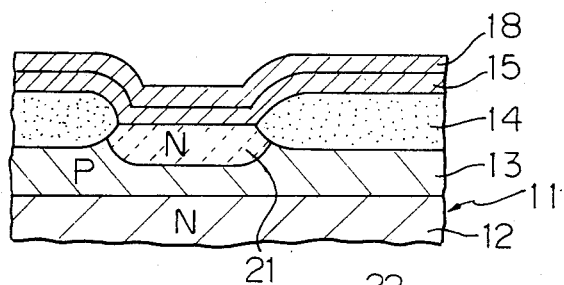

The obtained silicon substrate 11 is heated at an elevated temperature of from 950° C. to 1050° C. (e.g., 1000° C.) for a period of from 10 to 50 minutes (e.g., 15 minutes) under an inert atmosphere to diffuse the arsenic and phosphorus into the p-type base region 13. The arsenic directly diffuses into the base region 13 out of the first polycrystalline silicon film. Simultaneously, the phosphorus diffuses into the base region 13 through the first polycrystalline silicon film from the second polycrystalline silicon film. This results in the formation of a shallow n-type emitter region 21, as illustrated in FIG. 6. The depth of the emitter region 21 is, e.g., 0.3 μm, so that the width of the base region 13 under the emitter region becomes approximately 0.1 μm.

Figure 9:
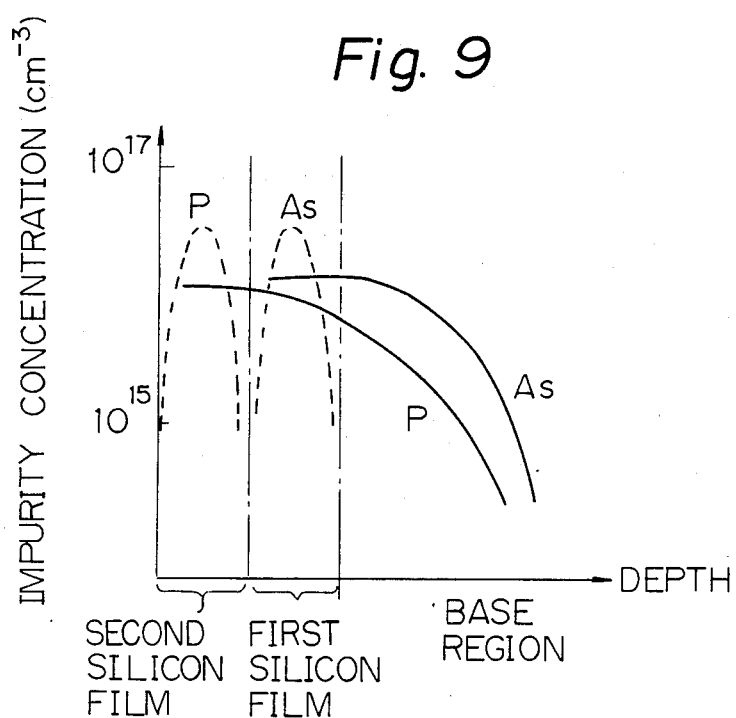
FIG. 9 is a graph showing the doping profile and diffusion profile of phosphorus and arsenic in the case of the present invention.

FIG. 9 illustrates the distribution of impurity concentration of the arsenic and the phosphorus, wherein the ordinate represents the impurity concentration and the abscissa represents the depth from the surface of the second polycrystalline film to the base region. The dotted line "As" indicates the doping profile of arsenic in the first polycrystalline silicon film, and the dotted line "P" indicates the doping profile of phosphorus in the second polycrystalline silicon film after the ion-implantation. The solid lines "As" and "P" indicate the diffusion profiles of arsenic and phosphorus, respectively, after the diffusion heat-treatment. It is apparent from FIG. 9 that the diffusion depth of phosphorus is controlled to not to exceed that of the arsenic, so that the depth of the n-type emitter region 21 is defined by the arsenic. Therefore, the method of the present invention allows easy and exact formation of a shallow junction and thus a narrow width of the base region by utilizing arsenic or antimony for defining the emitter depth. Furthermore, since both arsenic and phosphorus are present in the epitaxial layer of the silicon substrate, there is compensation for the the crystal lattice strain caused by the impurity diffusion. Accordingly, the performance and quality, e.g., the operating speed and the processing stability of the resultant bipolar transistor are improved.

Figure 7:
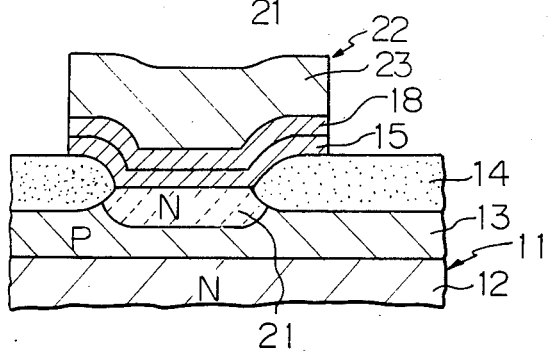

Next, as illustrated in FIG. 7, in order to produce an electrode 22 contacting the formed emitter region 21 in accordance with a conventional process, a metal (e.g., aluminum or aluminum alloy) film 23 is deposited on the second polycrystalline silicon film 18. The metal film 23 is selectively etched by using a patterned resist film (not shown) as a mask. The second and first polycrystalline silicon films 18 and 15 are also selectively etched to form the electrode 22.

Figure 8:
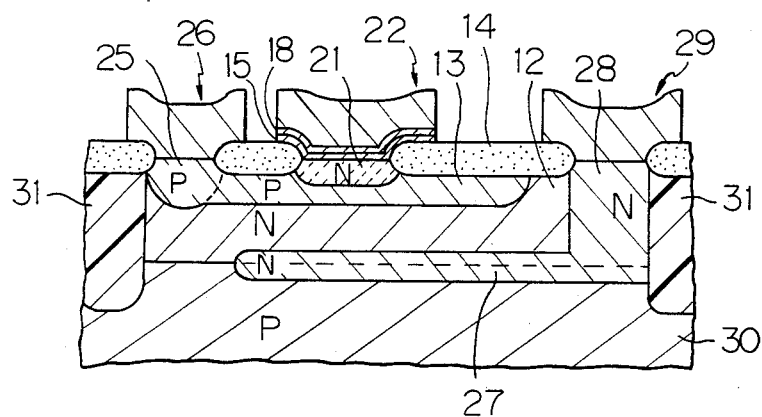
FIG. 8 is a sectional view of a bipolar transistor having an N-type emitter region formed in accordance with the method of the present invention.

An example of a bipolar transistor having the n-type emitter region 21 formed in accordance with the method of the present invention is illustrated in FIG. 8. In this case, the p-type base region 13 is joined to a base contact region 25, on which a base electrode 26 is formed. Under the n-type collector region 12, an n-type buried layer 27 is formed and is joined to a collector contact region 28 on which a collector electrode 29 is formed. There is a p-type silicon single crystalline substrate 30 on which the epitaxial layer comprising the collector region 12 and the base region 13 is formed. Furthermore, an isolating region 31 is formed to surround the active region (i.e., the collector, base, and emitter regions) of the bipolar transistor and is formed of, e.g., an insulating material.

It will be obvious that the present invention is not limited to the above-mentioned embodiment and that many variations are possible for persons skilled in the art without departing from the scope of the invention. For example, it is possible to use an amorphous silicon film or a silicide film of platinum or tungsten instead of the polycrystalline silicon film. In the above embodiment, the selective etching of the first and second polycrystalline silicon films is carried out after the thermal diffusion for the n-type emitter region. The polycrystalline silicon films may be selectively removed to leave a portion thereof within the window of the oxide film, prior to the thermal diffusion. Moreover, if a doped polycrystalline silicon film is used, the ion-implantation treatment can be omitted. Namely, it is possible to use a doped polycrystalline silicon film containing arsenic or antimony, the arsenic or antimony being added therein during the formation thereof by a CVD method, as the first polycrystalline silicon film, and to use a doped polycrystalline silicon film containing phosphorus, the phosphorus added during the formation thereof by a CVD method, as the second polycrystalline silicon film. Furthermore, the method of formation of a shallow n-type region according to the present invention can be applied to the formation of a source region or a drain region of a MOS FET. Shallow source and drain regions would contribute toward the miniaturization of the MOS FET and higher speed of the operation of the MOS FET.

What is claimed is:

1. A method of forming a shallow n-type region in a silicon semiconductor substrate of a semiconductor device comprising the steps of:
    (a) forming a first film containing one of arsenic and antimony on said silicon semiconductor substrate;
    (b) forming a second film containing phosphorus on said first film; and
    (c) diffusing the phosphorus and the one of arsenic and antimony into said silicon semiconductor substrate out of said first and second films by heat-treatment at a temperature between 950° C. and 1050° C.

2. A method according to claim 1, wherein said first film and said second film are made of a material selected from a group consisting of polycrystalline silicon, amorphous silicon, platinum silicide, and tungsten silicide.

3. A method according to claim 2,
   wherein step (a) comprises the step of doping the one of arsenic and antimony into said first film by ion-implantation; and
   wherein step (b) comprises the step of doping phosphorus into said second film by ion-implantation.

4. A method according to claim 2,
   wherein step (a) comprises the step of doping the one of arsenic and antimony into said first film during formation of said first film by chemical vapor deposition, and
   wherein step (b) comprises the step of doping the phosphorus into said second film during formation of said second film by chemical vapor deposition.

5. A method according to claim 2, wherein step (a) comprises the step of forming said first film to a thickness of from 0.05 to 0.15 μm.

6. A method according to claim 2, wherein step (b) comprises the step of forming said second film to a thickness of from 0.1 to 0.25 μm.

7. A method according to claim 1, wherein step (c) comprises the step of forming said shallow n-type region as an emitter region of a bipolar transistor.

8. A method according to claim 1, wherein step (c) comprises the step of forming said shallow n-type region as one of a drain region and a source region of a metal-oxide semiconductor field effect transistor.

* * * * *